US011329151B2

(12) United States Patent
Kinoshita et al.

(10) Patent No.: US 11,329,151 B2
(45) Date of Patent: May 10, 2022

(54) INSULATED-GATE SEMICONDUCTOR DEVICE AND METHOD OF MANUFACTURING THE SAME

(71) Applicant: FUJI ELECTRIC CO., LTD., Kawasaki (JP)

(72) Inventors: Akimasa Kinoshita, Matsumoto (JP); Yasuhiko Oonishi, Matsumoto (JP); Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 37 days.

(21) Appl. No.: 16/142,309

(22) Filed: Sep. 26, 2018

(65) Prior Publication Data

US 2019/0140091 A1 May 9, 2019

(30) Foreign Application Priority Data

Nov. 7, 2017 (JP) ............................ JP2017-214982

(51) Int. Cl.
*H01L 29/00* (2006.01)
*H01L 29/78* (2006.01)
(Continued)

(52) U.S. Cl.
CPC ...... *H01L 29/7813* (2013.01); *H01L 29/0623* (2013.01); *H01L 29/0696* (2013.01);
(Continued)

(58) Field of Classification Search
CPC ............. H01L 29/7813; H01L 29/0623; H01L 29/0696
See application file for complete search history.

(56) References Cited

U.S. PATENT DOCUMENTS 6,180,958 B1 1/2001 Cooper, Jr.
6,193,564 B1 2/2001 Loibl et al.
(Continued)

FOREIGN PATENT DOCUMENTS

JP 2001-511315 A 8/2001
JP 2009-194065 A 8/2009
(Continued)

OTHER PUBLICATIONS

Office Action issued by Japan Patent Office for Japanese Patent Application No. 2017-214982 dated Sep. 28, 2021, with machine English Translation (6 pages total).

*Primary Examiner* — Mounir S Amer
*Assistant Examiner* — Alexander Belousov

(57) ABSTRACT

An insulated-gate semiconductor device includes: an $n^+$-type current spreading layer disposed on an $n^-$-type drift layer; a p-type base region disposed on the current spreading layer; a $n^+$-type main-electrode region arranged in an upper portion of the base region; an insulated-gate electrode structure provided in a trench; and a $p^+$-type gate-bottom protection-region being in contact with a bottom of the trench, including a plurality of openings through which a part of the current spreading layer penetrates, being selectively buried in the current spreading layer, wherein positions of the openings cut on both sides of a central line of the trench are shifted from each other about the central line in a longitudinal direction of the trench in a planar pattern.

14 Claims, 12 Drawing Sheets

(51) Int. Cl.

| | |
|---|---|
| ***H01L 29/08*** | (2006.01) |
| ***H01L 29/739*** | (2006.01) |
| ***H01L 29/16*** | (2006.01) |
| ***H01L 29/66*** | (2006.01) |
| ***H01L 29/06*** | (2006.01) |
| ***H01L 29/10*** | (2006.01) |

(52) U.S. Cl.

CPC ........ *H01L 29/086* (2013.01); *H01L 29/1095* (2013.01); *H01L 29/1608* (2013.01); *H01L 29/66348* (2013.01); *H01L 29/7397* (2013.01)

(56) References Cited

U.S. PATENT DOCUMENTS

| | | | |
|---|---|---|---|
| 6,570,185 | B1 | 5/2003 | Tan |
| 9,647,108 | B2 | 5/2017 | Suzuki et al. |
| 10,177,251 | B2 * | 1/2019 | Shimizu .................. H01L 29/36 |
| 2009/0200559 | A1 | 8/2009 | Suzuki et al. |
| 2016/0247910 | A1 | 8/2016 | Suzuki et al. |
| 2016/0260709 | A1 * | 9/2016 | Rupp .................. H01L 27/0664 |

FOREIGN PATENT DOCUMENTS

| | | | |
|---|---|---|---|
| JP | 201572999 | A | 4/2015 |
| JP | 2017112161 | A | 6/2017 |
| WO | 2017/064949 | A1 | 4/2017 |

* cited by examiner

INSULATED-GATE SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2017-214982 filed on Nov. 7, 2017, the entire contents of which are incorporated by reference herein.

BACKGROUND OF THE INVENTION

1. Field of the Invention

The present invention relates to an insulated-gate semiconductor device having an insulated-gate electrode structure inside a trench, and a method of manufacturing the insulated-gate semiconductor device.

2. Description of the Related Art

Trench gate metal-oxide-semiconductor field-effect transistors (MOSFETs) are promising for a decrease in on-resistance with a reduction of a cell pitch, as compared with planar gate MOSFETs. Nevertheless, a disadvantage of such trench gate MOSFETs, which are made of a wide-bandgap semiconductor such as silicon carbide (SiC), is that a gate-insulating film allocated at a trench bottom is susceptive to damages ascribable to a higher voltage being applied to the gate-insulating film.

WO 2017/064949A discloses a semiconductor device including a first base region of $p^+$-type allocated between trenches adjacent to each other and a second base region of $p^+$-type disposed at each trench bottom, the first base region and the second base region being arranged into a matrix form, so as to relax electric field strength at the trench bottom. JP-T-2001-511315 A discloses a structure of a transistor including a protective region of p-type aligned with a bottom of a trench, the protective region being electrically grounded directly at its surface and extending to both ends of the trench. JP 2009-194065 A discloses a structure of a semiconductor device including deep layers of p-type buried perpendicular to a trench and extending to a depth deeper than the trench, allowing electric current to flow between a source electrode and a drain electrode in a channel layer.

However, the semiconductor device disclosed in WO 2017/064949 A has low tolerance to a short-circuit failure because of a presence of a junction field-effect transistor (JFET) interposed between the first base region and the second base region on both sides of the respective trenches. The structure disclosed in JP-T-2001-511315 A can suppress electric field strength in a gate, but inevitably has low breakdown voltage which is restricted by a fabrication process of the transistor, since the width of the respective trenches (the cell pitch) should approximate to each other. The structure disclosed in JP 2009-194065 A increases JFET regions to lead to an increase in on-resistance.

SUMMARY OF THE INVENTION

In view of the foregoing problems, the present invention provides an insulated-gate semiconductor device capable of relaxing strength of an electric field applied to a gate-insulating film allocated at a bottom of a trench and avoiding an increase in on-resistance while enhancing tolerance to a short-circuit failure, and a method of manufacturing the insulated-gate semiconductor device.

An aspect of the present invention inheres in an insulated-gate semiconductor device encompassing: a drift layer of a first conductivity type; a current spreading layer of the first conductivity type having a higher impurity concentration than the drift layer and disposed on the drift layer; a base region of a second conductivity type disposed on the current spreading layer; a main-electrode region of the first conductivity type having a higher impurity concentration than the drift layer and arranged in an upper portion of the base region; an insulated-gate electrode structure provided in a trench penetrating the main-electrode region and the base region; and a gate-bottom protection-region of the second conductivity type having a higher impurity concentration than the base region, provided with a plurality of openings through which a part of the current spreading layer penetrates, and selectively buried in the current spreading layer to be in contact with a bottom of the trench, wherein the openings cut on both sides of a central line of the trench are shifted from each other about the central line in a longitudinal direction of the trench in a planar pattern.

Another aspect of the present invention inheres in a method of manufacturing an insulated-gate semiconductor device, encompassing: forming a first current spreading layer of a first conductivity type on a drift layer of the first conductivity type, the first current spreading layer having a higher impurity concentration than the drift layer; selectively burying a gate-bottom protection-region of a second conductivity type in an upper portion of the first current spreading layer, the gate-bottom protection-region being provided with a plurality of openings through which a part of the current spreading layer penetrates so as to be exposed on a top surface of the gate-bottom protection-region; forming a second current spreading layer of the first conductivity type on the first current spreading layer and the gate-bottom protection-region, the second current spreading layer having an impurity concentration identical to the impurity concentration of the first current spreading layer; forming a base region of the second conductivity type on the second current spreading layer; forming a main-electrode region of the first conductivity type in an upper portion of the base region, the main-electrode region having a higher impurity concentration than the drift layer; forming a trench penetrating the base region to reach the gate-bottom protection-region; and providing an insulated-gate electrode structure inside the trench, wherein the openings cut on both sides of a central line of the trench are shifted from each other about the central line in a longitudinal direction of the trench in a planar pattern.

DETAILED DESCRIPTION OF THE INVENTION

Figure 1:
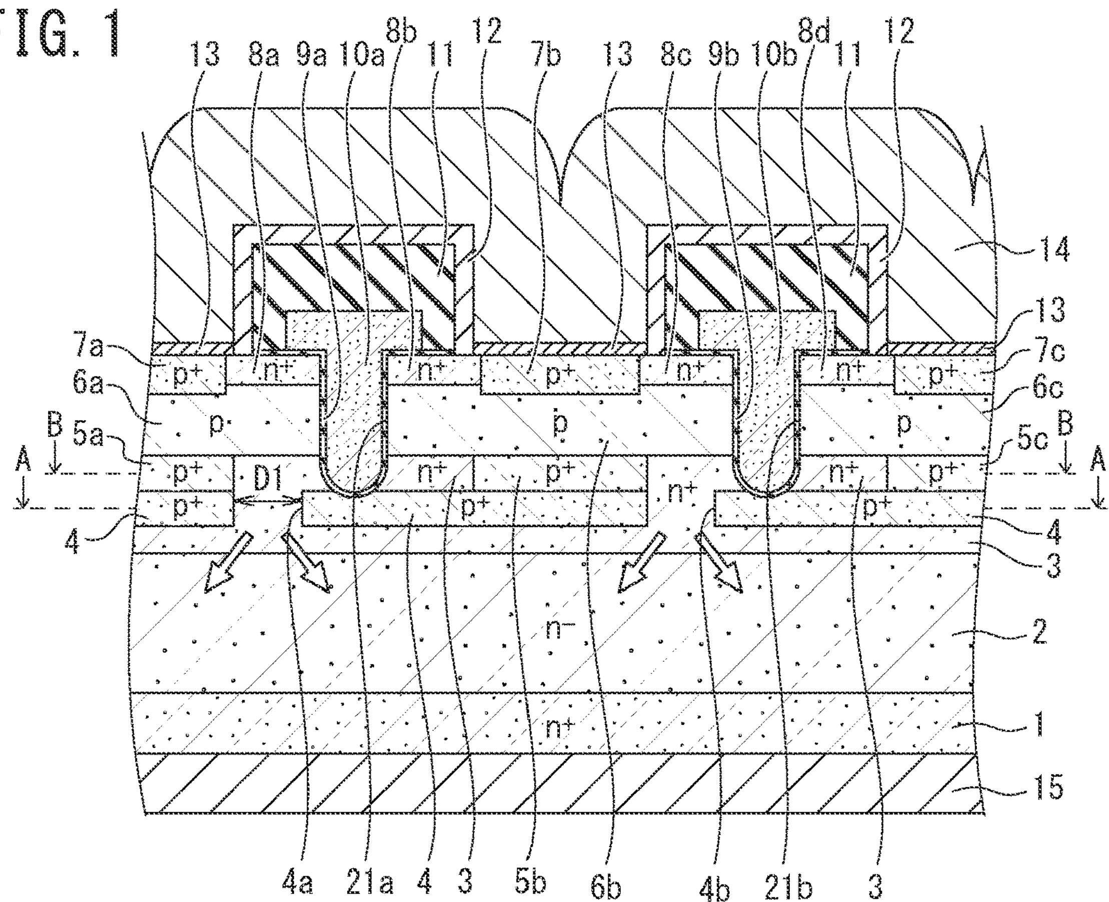
FIG. 1 is a cross-sectional view illustrating a main part of an insulated-gate semiconductor device according to a first embodiment of the present invention.

With reference to the Drawings, first and second embodiments of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first and second embodiments described below merely illustrate schematically semiconductor devices for specifying and giving shapes to the technical idea of the present invention, and the span of the technical idea is not limited to materials, shapes, structures, and relative positions of elements described herein.

In the Specification, a "first main-electrode region" is assigned to a semiconductor region which will be a source region or a drain region in a field-effect transistor (FET) or a static induction transistor (SIT), an emitter region or a collector region in an insulated-gate bipolar transistor (IGBT) and an anode region or a cathode region in a static induction (SI) thyristor or a gate turn-off (GTO) thyristor. A "second main-electrode region" is assigned to a semiconductor region which will not be the first main-electrode region and will be the source region or the drain region in the FET or the SIT, the emitter region or the collector region in the IGBT, and the anode region or the cathode region in the SI thyristor or the GTO thyristor. That is, when the first main-electrode region is the source region, the second main-electrode region means the drain region. When the first main-electrode region is the emitter region, the second main-electrode region means the collector region. When the first main-electrode region is the anode region, the second main-electrode region means the cathode region. In some appropriate cases, a function of the first main-electrode region and a function of the second main-electrode region are exchangeable each other by exchanging a bias relationship if the structure of the subject semiconductor device is symmetric. Furthermore, a "main-electrode region" is described in the Specification, the main-electrode region comprehensively means any one of the first main-electrode region and the second main-electrode region.

In the following description, the definitions of directions such as "top" and "bottom" are defined depending on cross-sectional views. For example, when the direction of a semiconductor device is changed by 90 degrees and is then observed, the terms "top" and "bottom" change to "left" and "right", respectively. When the observing direction of the semiconductor integrated circuit is changed by 180 degrees, the terms "top" and "bottom" shall be reversed. In the following description, an example in which a first conductivity type is an n-type and a second conductivity type is a p-type opposite to the first conductivity type will be described. However, the relationship between the conductivity types may be reversed such that the first conductivity type is a p-type and the second conductivity type is an n-type. In the Specification and the accompanying Drawings, semiconductor regions, being labeled with symbols "+" as superscript to "p" or "n", represent heavily doped semiconductor regions, of which the impurity concentration is higher than that of a semiconductor region without the superscript "+". And, the semiconductor regions, being labeled with symbols "−" as superscripts to "p" or "n", represent lightly doped semiconductor regions, of which the impurity concentration is lower than that of a semiconductor region without the superscript "−". Note that the heavily doped semiconductor regions or the lightly doped semiconductor regions, being labeled with superscript "+" or "−", do not mean the semiconductor regions which have strictly the same impurity concentrations.

First Embodiment

An insulated-gate semiconductor device, which is a metal-insulator-semiconductor field-effect transistor (MISFET), according to a first embodiment of the present invention includes a drift layer 2 of a first conductivity type (n-type), and a current spreading layer (CSL) 3 of $n^+$-type having a higher impurity concentration than the drift layer 2 and disposed on the top surface of the drift layer 2, as illustrated in FIG. 1. The CSL 3 includes an upper-layer extending-part selectively extending in a horizontal direction and a lower-layer main-part parallel to the upper-layer extending-part so as to implement an L-shaped hook illustrated in the cross-sectional view of FIG. 1, and connecting parts connecting the upper-layer extending-part and the lower-layer main-part in a vertical direction. The drift layer 2 and the CSL 3 are each an epitaxially-grown layer (hereinafter simply referred to as an "epitaxial layer") made of silicon carbide (SiC).

Base regions 6*a*, 6*b*, and 6*c* of a second conductivity type (p-type) are disposed on the top surface of the CSL 3. The base regions 6*a*, 6*b*, and 6*c* are each an epitaxial layer made of SiC. First main-electrode regions (source regions) 8*a*, 8*b*, 8*c*, and 8*d* of $n^+$-type having a higher impurity concentration than the drift layer 2 are selectively arranged at upper portions of the base regions 6*a*, 6*b*, and 6*c*. Base contact regions 7*a*, 7*b*, and 7*c* of $p^+$-type having a higher impurity concentration than the base regions 6*a*, 6*b*, and 6*c* are selectively arranged in contact with the source regions 8*a*, 8*b*, 8*c*, and 8*d* at the upper portions of the base regions 6*a*, 6*b*, and 6*c*.

Trenches 21*a* and 21*b* are provided to penetrate the source regions 8*a*, 8*b*, 8*c*, and 8*d* and the base regions 6*a*, 6*b*, and 6*c* from the top surfaces of the source regions 8*a*, 8*b*, 8*c*, and 8*d* to reach the CSL 3. Gate-insulating films 9*a* and 9*b* are laminated on the bottom and side surfaces of the trenches 21*a* and 21*b*. Examples of films used as the gate-insulating films 9*a* and 9*b* include a silicon oxide ($SiO_2$) film, a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, a bismuth oxide ($Bi_2O_3$) film, and a composite film including two or more of these films stacked on one another.

Gate electrodes 10*a* and 10*b* are buried in the trenches 21*a* and 21*b* via the gate-insulating films 9*a* and 9*b* to implement an insulated-gate electrode structure (9*a*, 9*b*, 10*a*, and 10*b*). A material used for the gate electrodes 10*a* and 10*b* may be a polysilicon layer (a doped polysilicon layer), which is doped heavily with impurity atoms such as phosphorus (P). While FIG. 1 illustrates the buried gate electrodes 10*a* and 10*b* which further extend to the top surfaces of the source regions 8*a*, 8*b*, 8*c*, and 8*d* via the gate-insulating films 9*a* and 9*b*, the gate electrodes 10*a* and 10*b* may be provided only inside the trenches 21*a* and 21*b*.

A layer of a gate-bottom protection-region 4 of $p^+$-type is disposed on the CSL 3 to be in contact with the bottoms of the trenches 21*a* and 21*b* and separated from the base regions 6*a*, 6*b*, and 6*c* such that the gate-bottom protection-region 4 is enfolded by the L-shaped hook of the CSL 3. The gate-bottom protection-region 4 protects the gate-insulating films 9*a* and 9*b* allocated at the bottoms of the trenches 21*a* and 21*b* from high voltage during reverse bias. FIG. 1 illustrates the structure in which the bottoms of the trenches 21*a* and 21*b* penetrate the upper-layer extending-part of the CSL 3 to be in contact with the gate-bottom protection-region 4; however, the present embodiment is not limited to the structure illustrated in FIG. 1. The bottoms of the trenches 21*a* and 21*b* may be allocated in the upper-layer extending-part of the CSL 3 between the base regions 6*a*, 6*b*, and 6*c* and the gate-bottom protection-region 4 without being in contact with the gate-bottom protection-region 4.

Figure 2:
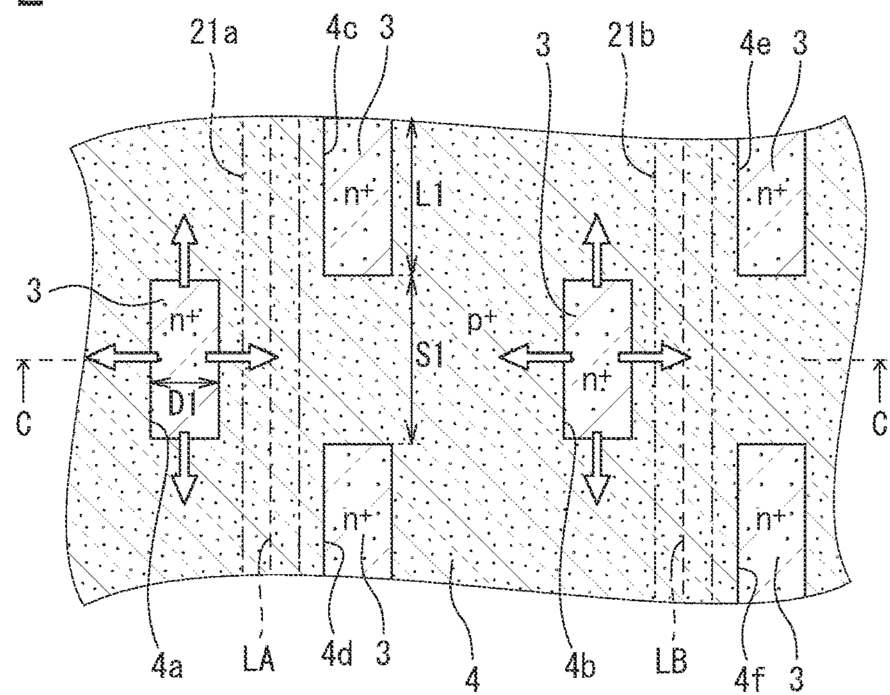
FIG. 2 is a cross-sectional view of the insulated-gate semiconductor device as viewed from direction A-A in FIG. 1.
Figure 3:
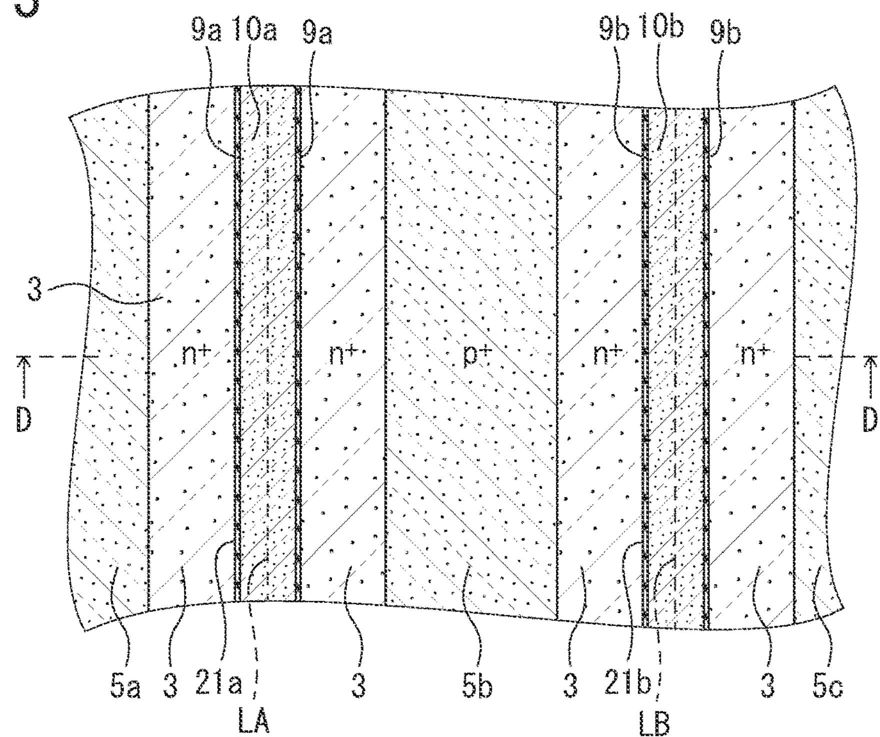
FIG. 3 is a cross-sectional view of the insulated-gate semiconductor device as viewed from direction B-B in FIG. 1.

FIG. 2 is a planar pattern horizontally cross-sectioned along the gate-bottom protection-region 4 as viewed from direction A-A in FIG. 1. FIG. 3 is a planar pattern horizontally cross-sectioned along the upper-layer extending-part of the CSL 3 as viewed from direction B-B in FIG. 1. FIG. 1 is the cross-sectional view as viewed from direction C-C in FIG. 2 and from direction D-D in FIG. 3. As illustrated in FIG. 3, the trenches 21*a* and 21*b* extend parallel to each other to have a striped planar pattern. FIG. 2 schematically indicates the positions of the trenches 21*a* and 21*b*, illustrated in FIG. 3, by the dashed and double-dotted lines (virtual lines). As illustrated in FIG. 1 and FIG. 2, the gate-bottom protection-region 4 is provided with a plurality of openings (JFET regions) 4*a*, 4*b*, 4*c*, 4*d*, 4*e*, and 4*f* elongated in the longitudinal direction of the trenches 21*a* and 21*b* in a planar pattern, allowing the connecting parts of the CSL 3 to penetrate in the vertical direction.

The openings 4*a*, 4*c*, and 4*d* each have a rectangular shape in a planar pattern through which the connecting parts of the CSL 3 penetrate, and are arranged alternately and periodically on both sides of a central line LA (indicated by the broken line) of the trench 21*a* to be shifted from each other about the central line LA in the longitudinal direction. The opening 4*a* is allocated on the left side of the trench 21*a*, and the openings 4*c* and 4*d* are allocated on the right side of the trench 21*a*. The openings 4*b*, 4*e*, and 4*f* each have a rectangular shape in a planar pattern through which the connecting parts of the CSL 3 penetrate, and are arranged alternately and periodically on both sides of a central line LB (indicated by the broken line) of the trench 21*b* and to be shifted from each other about the central line LB in the longitudinal direction in the same manner as the openings 4*a*, 4*c*, and 4*d*. The opening 4*b* is allocated on the left side of the trench 21*b*, and the openings 4*e* and 4*f* are allocated on the right side of the trench 21*b*.

The number of the openings 4*a*, 4*b*, 4*c*, 4*d*, 4*e*, and 4*f* is optional, and more than the number of the openings illustrated may be arranged alternately and periodically in the longitudinal direction of the trenches 21*a* and 21*b*. The width D1, length L1, and interval S1 of the rectangular openings 4*a*, 4*b*, 4*c*, 4*d*, 4*e*, and 4*f* may be determined as appropriate. For example, the respective openings 4*a*, 4*b*, 4*c*, 4*d*, 4*e*, and 4*f* have the width D1 of about one micrometer, the length L1 of about 15 micrometers, and the interval S1 of about 15 micrometers. The respective openings 4*a*, 4*b*, 4*c*, 4*d*, 4*e*, and 4*f* may have the common width D1, length L1, and interval S1, or may have different widths, lengths, and intervals.

The length L1 and the interval S1 of the respective openings 4*a*, 4*b*, 4*c*, 4*d*, 4*e*, and 4*f* may be the same or different from each other. For example, the length L1 of the respective openings 4*a*, 4*b*, 4*c*, 4*d*, 4*e*, and 4*f* may be longer than the interval S1. When the length L1 is longer than the interval S1, the openings 4*a* and 4*b* may overlap the openings 4*c*, 4*d*, 4*e*, and 4*f* in the length direction as viewed in a direction perpendicular to the longitudinal direction of the trenches 21*a* and 21*b* (in a parallel direction of the trenches 21*a* and 21*b*). When the length L1 is shorter than the interval S1, spaces may be present in which the openings 4*c*, 4*d*, 4*e*, and 4*f* are not provided as viewed from the openings 4*a* and 4*b* in the direction perpendicular to the longitudinal direction of the trenches 21*a* and 21*b*.

The impurity concentration of the CSL 3 is, for example, about $1\times10^{17}$ $cm^{-3}$, which depends on the area of the openings 4*a*, 4*b*, 4*c*, 4*d*, 4*e*, and 4*f*. The impurity concentration of the CSL 3 may become lower and lower as the area of the openings 4*a*, 4*b*, 4*c*, 4*d*, 4*e*, and 4*f* becomes wider and wider. FIG. 1 and FIG. 2 illustrate a flow of current, schematically indicated by the arrows, flowing toward the drift layer 2 from channels formed in the base regions 6*a*, 6*b*, and 6*c* on the gate electrode 10*a* and 10*b* side through the connecting parts of the CSL 3 penetrating the openings 4*a* and 4*b*. Since the connecting parts of the CSL 3, which penetrate the openings 4*a*, 4*b*, 4*c*, 4*d*, 4*e*, and 4*f*, have a rectangular pattern, the current can flow in a two-dimensional direction from the CSL 3 through the openings 4*a*, 4*b*, 4*c*, 4*d*, 4*e*, and 4*f*.

Base-bottom buried-regions 5*a*, 5*b*, and 5*c* of $p^+$-type are buried at the same horizontal level as the upper-layer extending-part of the CSL 3 and allocated below the base contact regions 7*a*, 7*b*, and 7*c* illustrated in FIG. 1 so as to partly cover the gate-bottom protection-region 4. The base-bottom buried-regions 5*a*, 5*b*, and 5*c* are separated from the trenches 21*a* and 21*b* and in contact with the bottom surfaces of the base regions 6*a*, 6*b*, and 6*c* and the top surface of the gate-bottom protection-region 4. Lower ends of the channels formed in the base regions 6*a*, 6*b*, and 6*c* on the gate electrode 10*a* and 10*b* side are in contact with the upper-layer extending-part of the CSL 3. As illustrated in FIG. 3, the base-bottom buried-regions 5*a*, 5*b*, and 5*c* allocated at the same horizontal level as the upper-layer extending-part of the CSL 3, have a striped planar pattern and extend parallel to the longitudinal direction of the trenches 21*a* and 21*b*.

As illustrated in FIG. 1, a first main-electrode (a source electrode) 14 is disposed over the gate electrodes 10*a* and 10*b* via an interlayer-insulating film 11. The interlayer-insulating film 11 may be a non-doped silicon oxide ($SiO_2$) film without including phosphorus (P) or boron (B), which is referred to as non-doped silicate glass (NSG). Other examples of films used as the interlayer-insulating film 11 include a phosphosilicate glass (PSG) film, a borosilicate glass (BSG) film, a borophosphosilicate glass (BPSG) film, and a silicon nitride ($Si_3N_4$) film. The source electrode 14 is electrically connected to the source regions 8*a*, 8*b*, 8*c*, and 8*d* and the base contact regions 7*a*, 7*b*, and 7*c*. The source electrode 14 is provided away from a gate surface electrode (not illustrated) allocated on the deeper side of the sheet of the drawing. The gate surface electrode may be made of the same material as the source electrode 14.

A source contact-layer 13 and a barrier-metal layer 12 serving as underlying-metallic layer are inserted under the source electrode 14. The source contact-layer 13 is metallurgically connected to ends of the source regions 8*a*, 8*b*, 8*c*, and 8*d* and the base contact regions 7*a*, 7*b*, and 7*c*. The barrier-metal layer 12 is metallurgically connected to the source regions 8*a*, 8*b*, 8*c*, and 8*d* and extends from the source regions 8*a*, 8*b*, 8*c*, and 8*d* to cover the side and top surfaces of the interlayer-insulating film 11. The source electrode 14 covers the source contact-layer 13 and the barrier-metal layer 12. The source contact-layer 13 is a nickel silicide ($NiSi_x$) film, the barrier-metal layer 12 is a titanium nitride (TiN) film, and the source electrode 14 is an aluminum (Al) film, for example.

A second main-electrode region (a drain region) 1 of $n^+$-type is arranged in contact with the bottom surface of the drift layer 2. The drain region 1 is implemented by a semiconductor substrate made of SiC (a SiC substrate). A second main-electrode (a drain electrode) 15 is disposed on the bottom surface of the drain region 1. The drain electrode 15 may be a single metallic film made of gold (Au) or a layered metallic film made of Al, nickel (Ni), and Au stacked in this order. A metallic film such as molybdenum (Mo) or tungsten (W), or an alloy layer including Ni and titanium (Ti) stacked to react with SiC may further be stacked on the lowermost layer of the layered metallic film.

FIG. 1 is the cross-sectional view mainly illustrating a structure including two unit cells each including either the trench 21*a* or the trench 21*b*. The insulated-gate semiconductor device according to the first embodiment can be a power semiconductor device including a plurality of such unit cells arranged periodically to form a multi-channel structure so as to achieve a larger rated current.

The insulated-gate semiconductor device according to the first embodiment operates, being applied with a positive voltage to the drain electrode 15, while being applied with a positive voltage of a threshold or greater to the gate electrodes 10*a* and 10*b*. The application of such positive voltage generates inversion layers (channels) in the base regions 6*a*, 6*b*, and 6*c* on the gate electrode 10*a* and 10*b* side so as to turn on. A current then flows during the conductive state from the drain electrode 15 to the source electrode 14 through the drain region 1, the drift layer 2, the CSL 3, the inversion layers of the base regions 6*a*, 6*b*, and 6*c*, and the source regions 8*a*, 8*b*, 8*c*, and 8*d*. No current flows from the drain electrode 15 to the source electrode 14 to lead the insulated-gate semiconductor device to turn off when the voltage applied to the gate electrodes 10*a* and 10*b* is less than the threshold, since no inversion layer is induced in the base regions 6*a*, 6*b*, and 6*c*.

The insulated-gate semiconductor device according to the first embodiment includes the gate-bottom protection-region 4 provided in contact with the bottoms of the trenches 21*a* and 21*b*, as a localized pattern. The gate-bottom protection-region 4 can thus protect the gate-insulating films 9*a* and 9*b* allocated at the bottoms of the trenches 21*a* and 21*b* from high voltage during reverse bias. Therefore, it is possible to improve breakdown voltage and reliability of the insulated-gate semiconductor device.

Furthermore, the insulated-gate semiconductor device according to the first embodiment arranges the openings 4*a*, 4*b*, 4*c*, 4*d*, 4*e*, and 4*f* in the gate-bottom protection-region 4 to be shifted from each other about the central lines LA and LB in the longitudinal direction of the trenches 21*a* and 21*b* in a planar pattern. Therefore, it is possible to reduce saturation current to enhance tolerance to a short-circuit failure.

Furthermore, the insulated-gate semiconductor device according to the first embodiment includes the gate-bottom protection-region 4 having the openings 4*a*, 4*b*, 4*c*, 4*d*, 4*e*, and 4*f*. A current is spread out having components in the two-dimensional direction through the connecting parts of the CSL 3 penetrating the openings 4*a*, 4*b*, 4*c*, 4*d*, 4*e*, and 4*f*. The insulated-gate semiconductor device can thus reduce JFET resistance to avoid an increase in on-resistance. The structure according to the first embodiment can reduce the chip size of the insulated-gate semiconductor device, reducing the cost of manufacture.

Next, a method of manufacturing the insulated-gate semiconductor device, which is a trench gate MISFET according to the first embodiment, is illustrated below with reference to FIG. 3 to FIG. 15. It should be understood that the method of manufacturing the trench gate MISFET described below is a mere example, and the embodiment of the present invention can implement various methods other than the following method including modified examples within the technical scope prescribed by Claims of the present invention.

Figure 4:
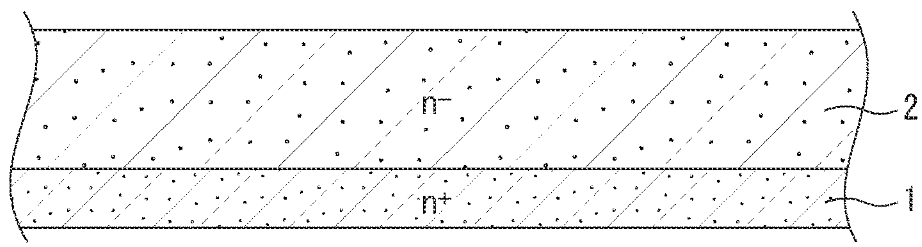
FIG. 4 is a cross-sectional view illustrating a process of manufacturing the insulated-gate semiconductor device according to the first embodiment.
Figure 5:
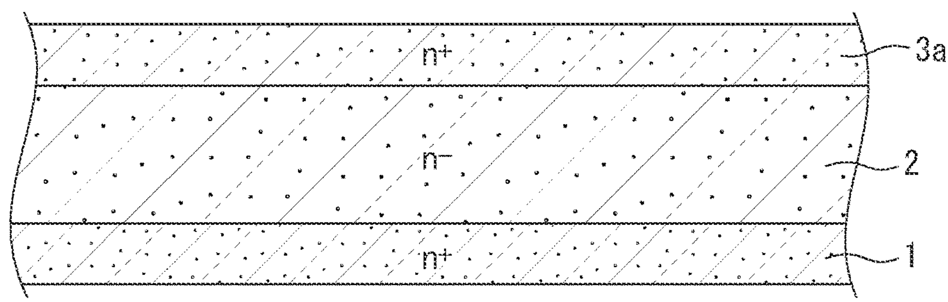
FIG. 5 is a cross-sectional view continued from FIG. 4 illustrating the process of manufacturing the insulated-gate semiconductor device according to the first embodiment.

First, an $n^+$-type semiconductor substrate (SiC substrate) doped with n-type impurity ions such as nitrogen (N) is prepared. As illustrated in FIG. 4, the n-type drift layer 2 is epitaxially grown on the top surface of the $n^+$-type SiC substrate used as the drain region 1. The top surface of the drift layer 2 is then subjected to multiple ion implantations with n-type impurity ions such as N. The implanted n-type impurity ions are then activated by annealing, so as to form an $n^+$-type first CSL 3*a*, as illustrated in FIG. 5. Alternatively, the first CSL 3*a* may be epitaxially grown on the top surface of the drift layer 2.

Figure 6:
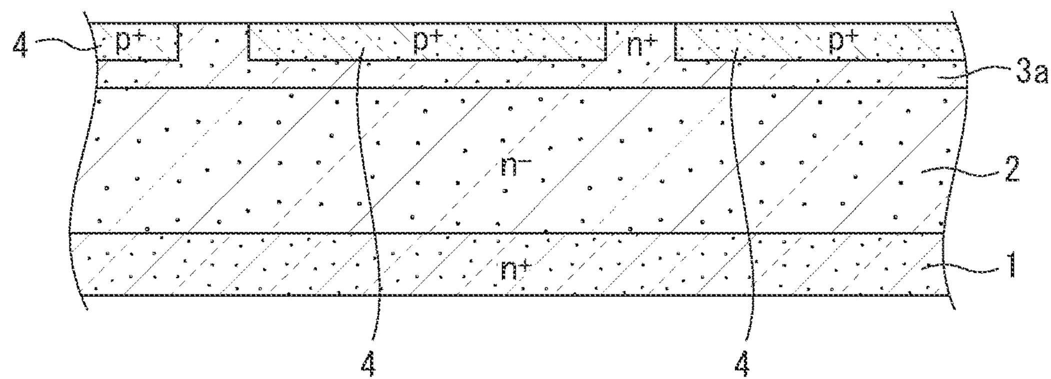
FIG. 6 is a cross-sectional view continued from FIG. 5 illustrating the process of manufacturing the insulated-gate semiconductor device according to the first embodiment.

Next, a photoresist film is coated on the top surface of the first CSL 3*a*, and is delineated by photolithography. Using the delineated photoresist film as an ion-implantation mask, the first CSL 3*a* is subjected to multiple ion implantations with p-type impurity ions such as Al. After the ion-implantation mask is removed, the implanted p-type impurity ions are activated by annealing. The $p^+$-type gate-bottom protection-region 4 is thus selectively formed in the first CSL 3*a*, as illustrated in FIG. 6, having a pattern in which the connecting parts of the first CSL 3*a* penetrate the openings of the gate-bottom protection-region 4 to be exposed on the upper surface. Instead of the use of the photoresist film as the ion-implantation mask, an oxide film may be formed on the top surface of the first CSL 3*a* and delineated by a photoresist film, so that the delineated oxide film is used as an ion-implantation mask.

Figure 7:
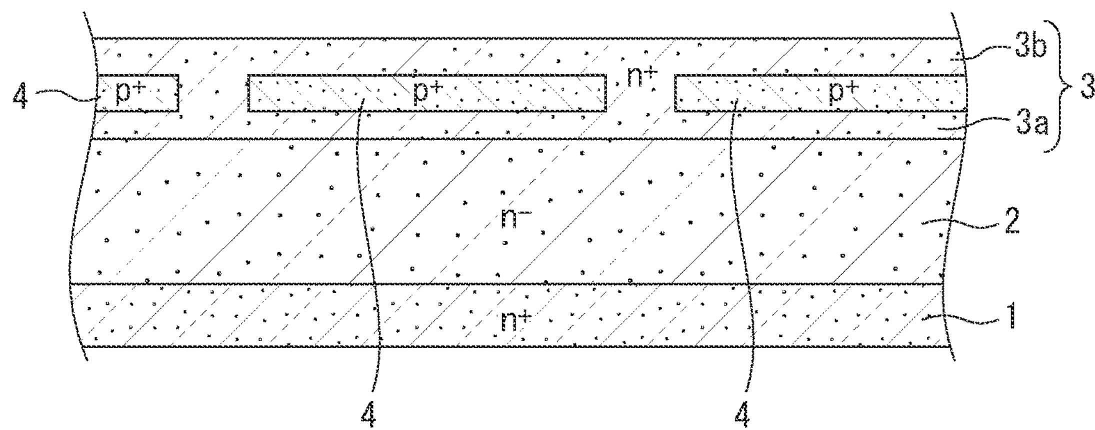
FIG. 7 is a cross-sectional view continued from FIG. 6 illustrating the process of manufacturing the insulated-gate semiconductor device according to the first embodiment.

Next, as illustrated in FIG. 7, an $n^+$-type second CSL 3*b* having the same impurity concentration as the first CSL 3*a* is epitaxially grown on the top surface of the first CSL 3*a*. The CSL 3 is implemented by the first CSL 3*a* and the second CSL 3*b*. Namely, the second CSL 3*b* is deposited on the gate-bottom protection-region 4 to serve as the upper-layer extending-part of the CSL 3, while the lower-layer main-part of the first CSL 3*a* remains under the gate-bottom protection-region 4. The upper-layer extending-part includes the second CSL 3*b* and the lower-layer main-part implemented by the first CSL 3*a* are connected by the connecting parts implemented by the first CSL 3*a* in the vertical direction, so as to provide the CSL 3 having a hook-like shape in cross section.

Figure 8:
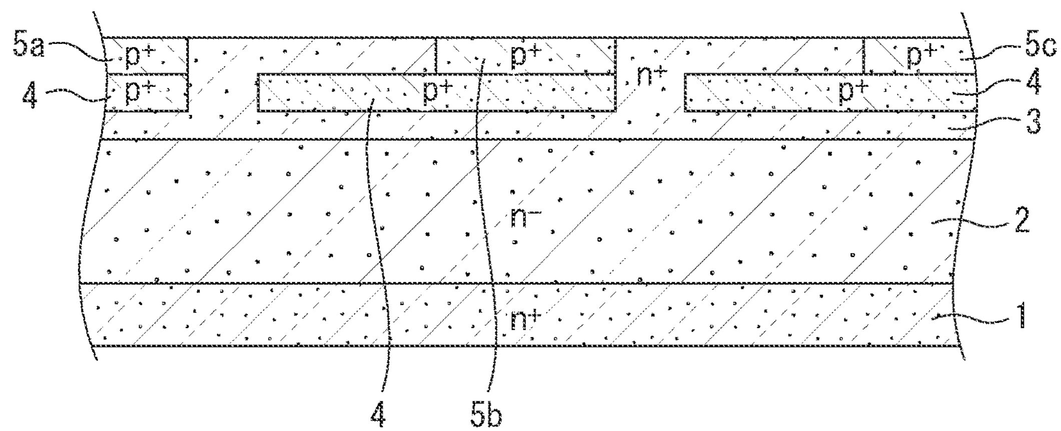
FIG. 8 is a cross-sectional view continued from FIG. 7 illustrating the process of manufacturing the insulated-gate semiconductor device according to the first embodiment.

Next, a photoresist film is coated on the top surface of the CSL 3, and is delineated by photolithography. Using the delineated photoresist film as an ion-implantation mask, the CSL 3 is subjected to multiple ion implantations with p-type impurity ions such as Al. After the ion-implantation mask is removed, the implanted p-type impurity ions are activated by annealing. The $p^+$-type base-bottom buried-regions 5*a*, 5*b*, and 5*c* are thus selectively formed at the upper portion of the CSL 3, as illustrated in FIG. 8. Instead of the use of the photoresist film as the ion-implantation mask, an oxide film may be formed on the top surface of the CSL 3 and delineated by a photoresist film, so that the delineated oxide film is used as an ion-implantation mask.

Figure 9:
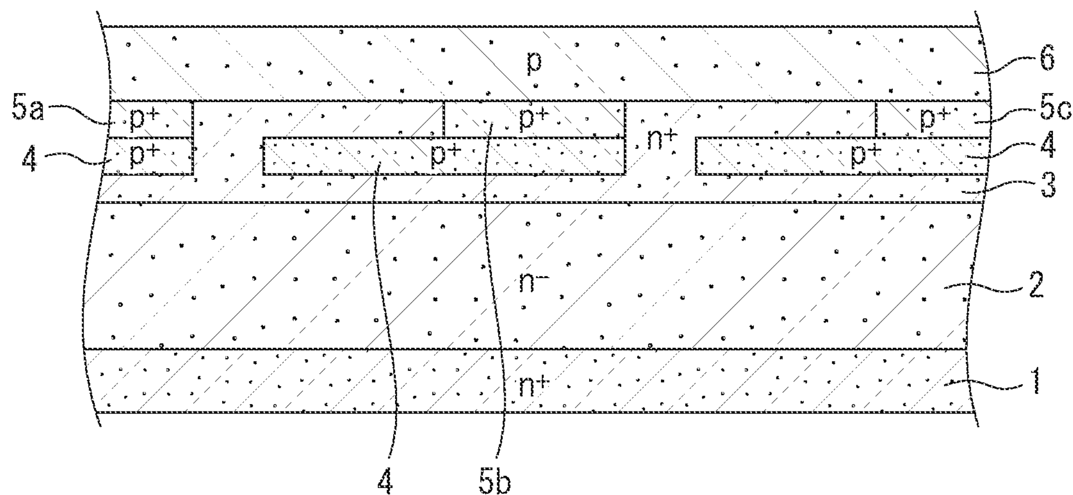
FIG. 9 is a cross-sectional view continued from FIG. 8 illustrating the process of manufacturing the insulated-gate semiconductor device according to the first embodiment.
Figure 10:
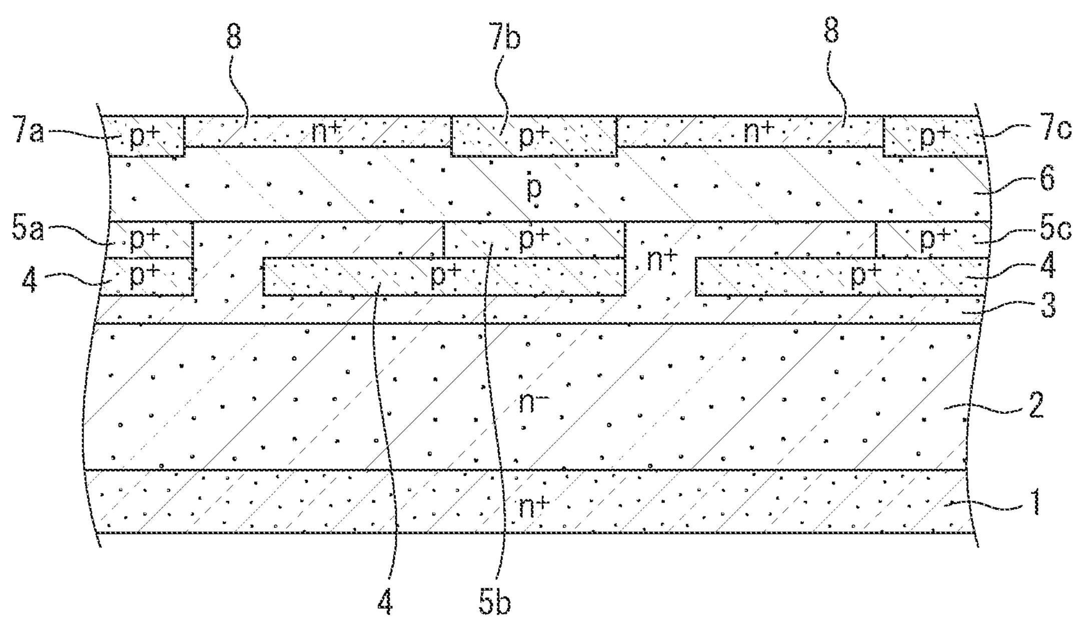
FIG. 10 is a cross-sectional view continued from FIG. 9 illustrating the process of manufacturing the insulated-gate semiconductor device according to the first embodiment.

Next, as illustrated in FIG. 9, the p-type base region 6 is epitaxially grown on the top surface of the CSL 3. A photoresist film is then coated on the top surface of the base region 6, and is delineated by photolithography. Using the delineated photoresist film as an ion-implantation mask, the base region 6 is subjected to multiple ion implantations with n-type impurity ions such as N. After the ion-implantation mask is removed, a photoresist film is further coated on the top surface of the base region 6, and is delineated by photolithography. Using the delineated photoresist film as an ion-implantation mask, the base region 6 is further subjected to multiple ion implantations with p-type impurity ions such as Al. After the ion-implantation mask is removed, the implanted n-type and p-type impurity ions are activated by annealing. The $n^+$-type source region 8 and the $p^+$-type base contact regions 7*a*, 7*b*, and 7*c* are thus selectively formed on the top surface of the base region 6, as illustrated in FIG. 10. Instead of the use of the photoresist film as the ion-implantation mask, an oxide film may be formed on the top surface of the CSL 3 and delineated by a photoresist film, and n-type impurity ions or p-type impurity ions may be implanted using the delineated oxide film as an ion-implantation mask.

The method is illustrated with the case in which the annealing is performed each time the ion implantation step is performed to form the gate-bottom protection-region 4, the base-bottom buried-regions 5*a*, 5*b*, and 5*c*, the source region 8, and the base contact regions 7*a*, 7*b*, and 7*c*. However, the annealing is not necessarily performed each time the ion implantation step is performed. For example, single annealing may be performed to collectively activate the respective ion-implanted regions after all ion implantations are performed to form the gate-bottom protection-region 4, the base-bottom buried-regions 5*a*, 5*b*, and 5*c*, the source region 8, and the base contact regions 7*a*, 7*b*, and 7*c*.

Figure 11:
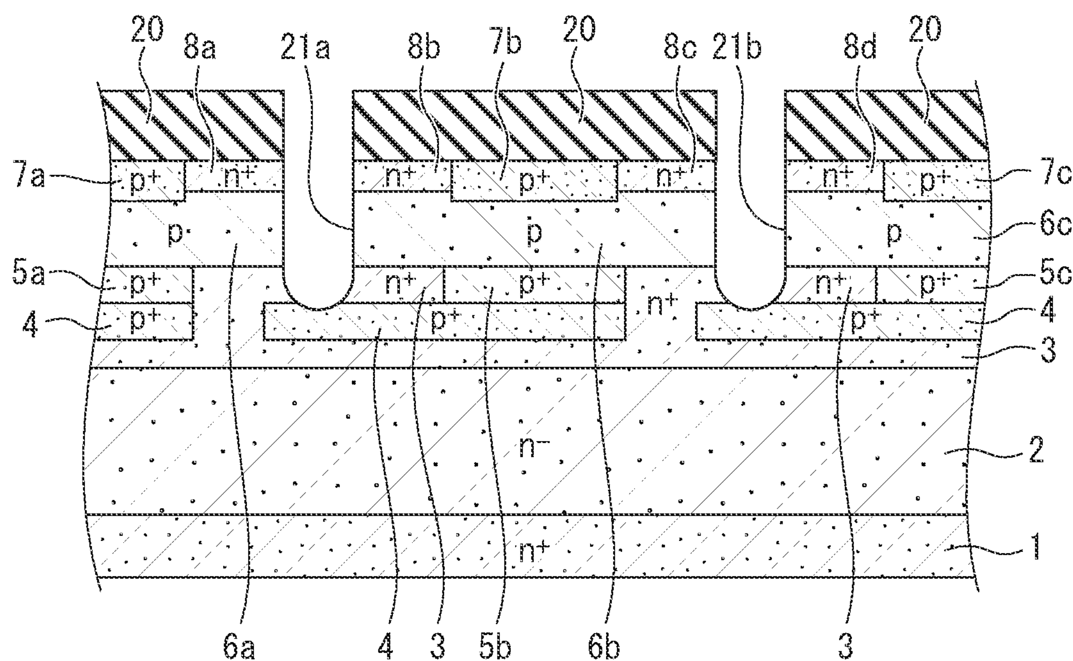
FIG. 11 is a cross-sectional view continued from FIG. 10 illustrating the process of manufacturing the insulated-gate semiconductor device according to the first embodiment.

Next, a photoresist film 20 is coated on the top surfaces of the source region 8 and the base contact regions 7*a*, 7*b*, and 7*c*, and is delineated by photolithography. Using the delineated photoresist film 20 as an etching mask, the trenches 21*a* and 21*b* are selectively cut by dry etching such as reactive ion etching (RIE), as illustrated in FIG. 11. The trenches 21*a* and 21*b* penetrate the source regions 8*a*, 8*b*, 8*c*, and 8*d* and the base regions 6*a*, 6*b*, and 6*c* to reach the upper part of the CSL 3. The photoresist film 20 is then removed. Instead of the use of the photoresist film 20 as the etching mask, an oxide film may be formed on the top surfaces of the source region 8 and the base contact regions 7*a*, 7*b*, and 7*c* and delineated by a photoresist film, so that the delineated oxide film is used as an etching mask.

Figure 12:
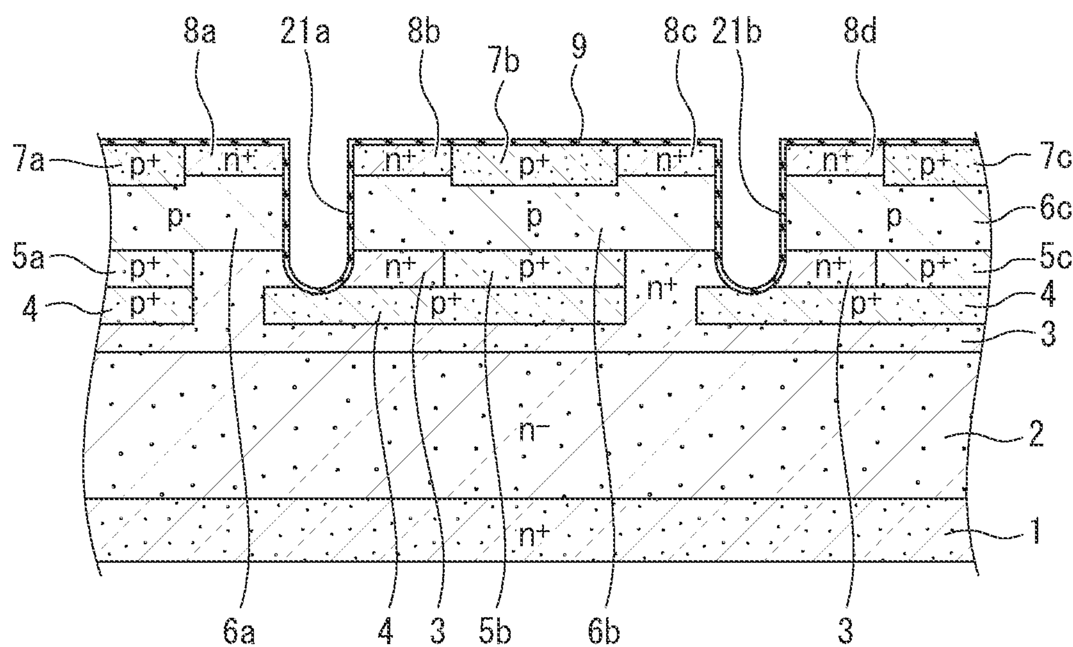
FIG. 12 is a cross-sectional view continued from FIG. 11 illustrating the process of manufacturing the insulated-gate semiconductor device according to the first embodiment.
Figure 13:
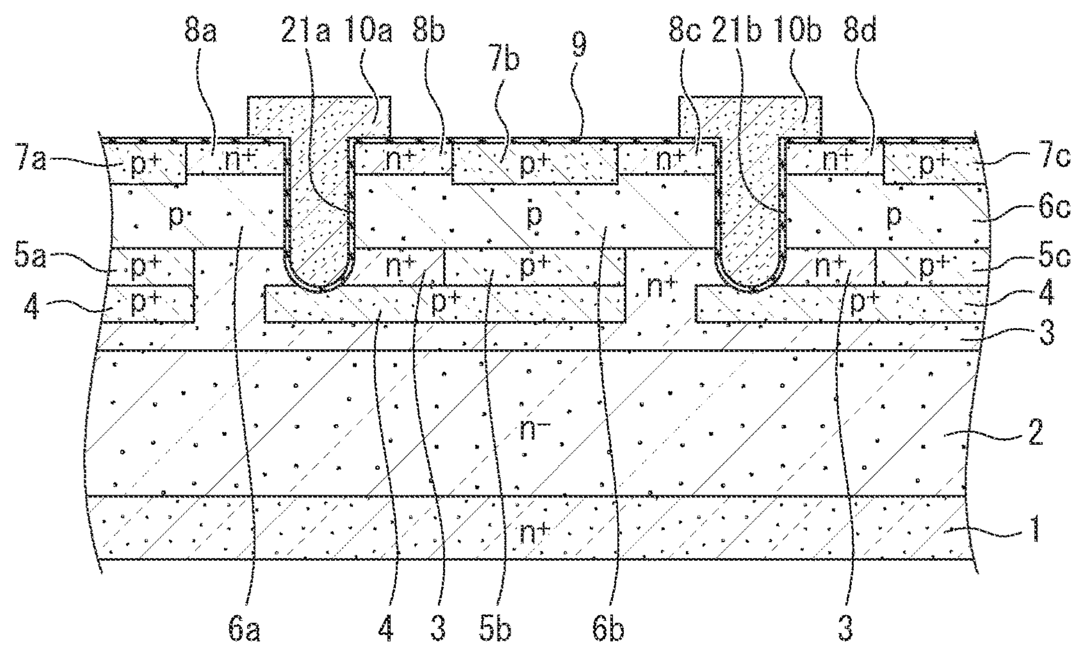
FIG. 13 is a cross-sectional view continued from FIG. 12 illustrating the process of manufacturing the insulated-gate semiconductor device according to the first embodiment.

Next, the gate-insulating film 9 such as a $SiO_2$ film is laminated on the bottom and side surfaces of the trenches 21*a* and 21*b* and the top surfaces of the source regions 8*a*, 8*b*, 8*c*, and 8*d* and the $p^+$-type base contact regions 7*a*, 7*b*, and 7*c* by a thermal oxidation method or a chemical vapor deposition (CVD) method, as illustrated in FIG. 12. A polysilicon layer (a doped polysilicon layer), which is heavily doped with impurity atoms such as P, is then deposited to fill the trenches 21*a* and 21*b* by a CVD method. Subsequently, a part of the polysilicon layer is selectively removed by photolithography and dry etching, so as to cut the gate electrodes 10*a* and 10*b* made of the polysilicon layer to provide an insulated-gate electrode structure (9, 10*a*, and 10*b*), as illustrated in FIG. 13.

Figure 14:
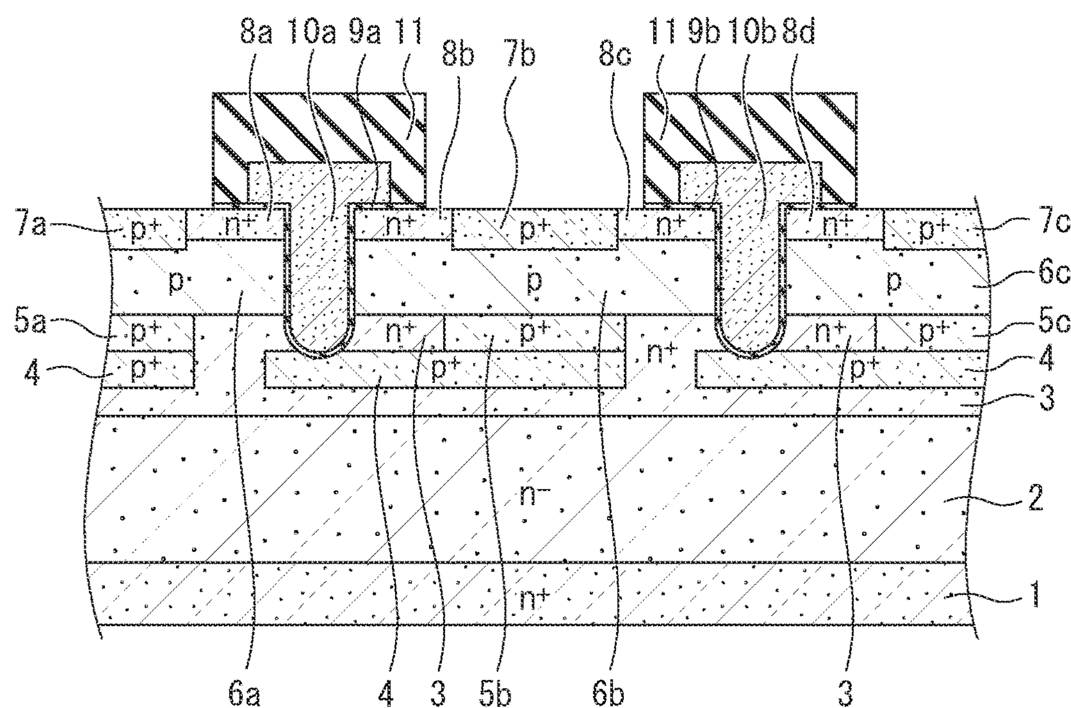
FIG. 14 is a cross-sectional view continued from FIG. 13 illustrating the process of manufacturing the insulated-gate semiconductor device according to the first embodiment.

Next, the interlayer-insulating film 11 is deposited by a CVD method on the top surface of the insulated-gate electrode structure (9, 10*a*, and 10*b*), which includes the gate electrodes 10*a* and 10*b* and the gate-insulating film 9. The interlayer-insulating film 11 and the gate-insulating film 9 are then selectively removed by photolithography and dry etching, as illustrated in FIG. 14, so that source contact-holes are cut in the interlayer-insulating film 11 and the gate-insulating film 9. Although not illustrated in the drawings, gate contact-holes are also cut in the interlayer-insulating film 11 and the gate-insulating film 9 at positions different from the source contact-holes so that a part of the gate surface electrode connected to the gate electrodes 10*a* and 10*b* is exposed.

Figure 15:
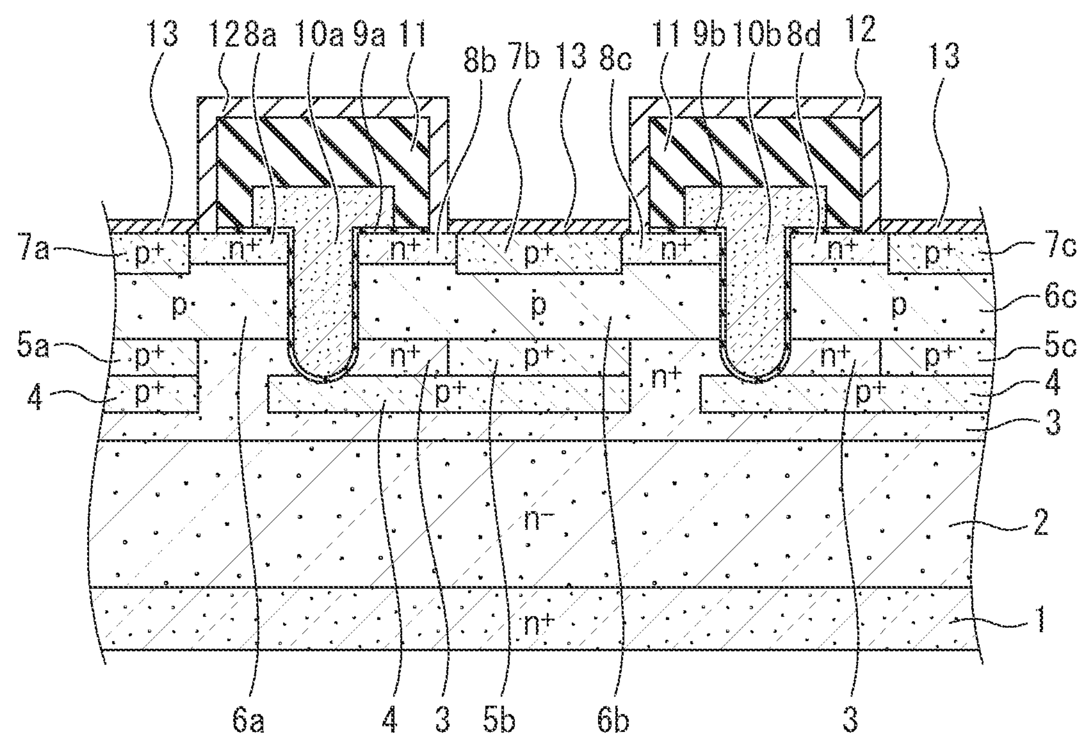
FIG. 15 is a cross-sectional view continued from FIG. 14 illustrating the process of manufacturing the insulated-gate semiconductor device according to the first embodiment.

Next, a metallic layer such as a Ni film is deposited by sputtering, an evaporation method or the like. Then, the metallic layer is cut by photolithography and RIE or the like, and subjected to rapid thermal annealing (RTA) at 1000° C., for example, so as to form the source contact-layer 13. A metallic layer such as a TiN film is further deposited by sputtering or the like, and is delineated by photolithography and RIE or the like, so as to form the barrier-metal layer 12. The source contact-layer 13 is thus formed on the top surfaces of the base contact regions 7*a*, 7*b*, and 7*c* and the source regions 8*a*, 8*b*, 8*c*, and 8*d*, and the barrier-metal layer 12 is formed to cover the interlayer-insulating film 11, as illustrated in FIG. 15.

Next, a metallic layer such as an Al film is deposited by sputtering or the like, and is delineated by photolithography and RIE or the like, so as to define the source electrode 14 and the gate surface electrode (not illustrated). The delineated source electrode 14 and the gate surface electrode are thus separated from each other. Thereafter, the drain electrode 15 made of metal such as Au is formed on the entire bottom surface of the drain region 1 by sputtering, an evaporation method or the like. Accordingly, the insulated-gate semiconductor device illustrated in FIG. 1 is completed.

The method of manufacturing the insulated-gate semiconductor device according to the first embodiment can relax strength of an electric field applied to the gate-insulating films allocated at the bottoms of the trenches and avoid an increase in on-resistance while enhancing tolerance to a short-circuit failure.

Second Embodiment

Figure 16:
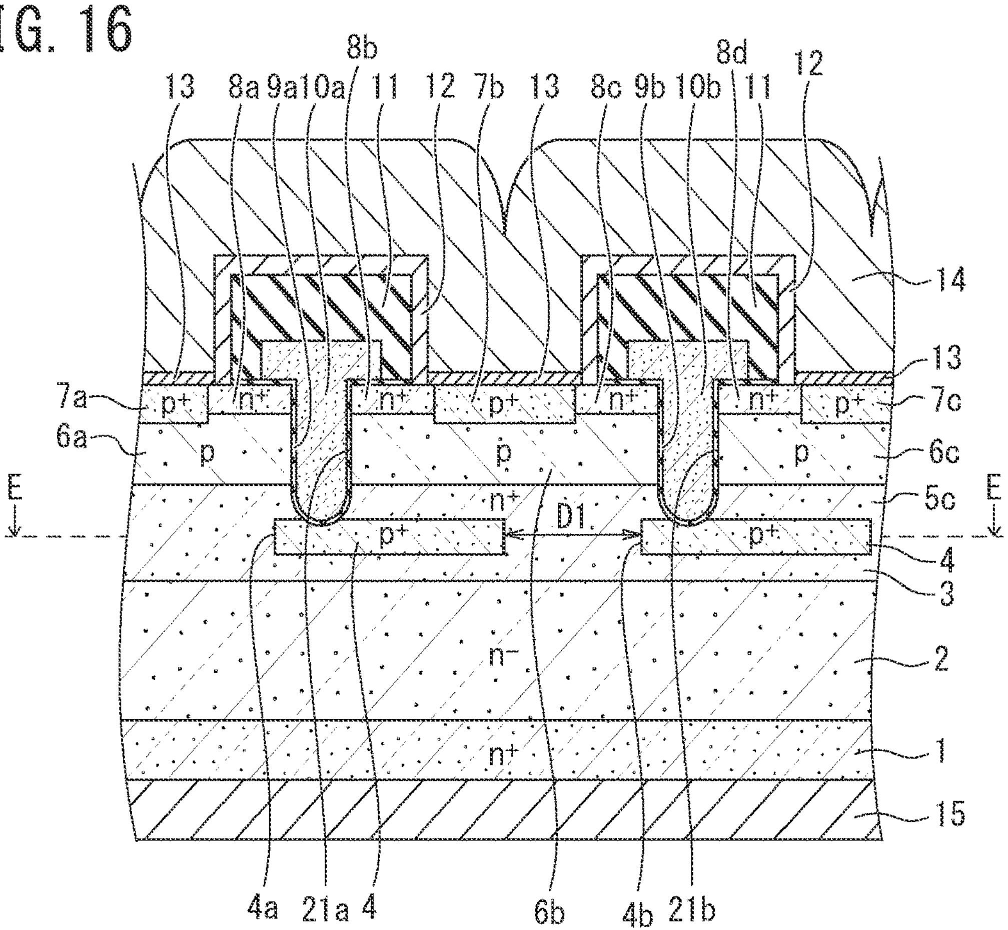
FIG. 16 is a cross-sectional view illustrating a main part of an insulated-gate semiconductor device according to a second embodiment of the present invention.

An insulated-gate semiconductor device according to a second embodiment of the present invention differs from the insulated-gate semiconductor device according to the first embodiment in that a pitch between unit cells is narrower, as illustrated in FIG. 16. The gate-bottom protection-region 4 is arranged in the CSL 3 to be in contact with the trenches 21*a* and 21*b* and separated from the base contact regions 7*a*, 7*b*, and 7*c*. The insulated-gate semiconductor device according to the second embodiment does not include the base-bottom buried-regions 5*a*, 5*b*, and 5*c* illustrated in FIG. 1 and FIG. 3 at the same horizontal level as the upper-layer extending-part of the CSL 3.

Figure 17:
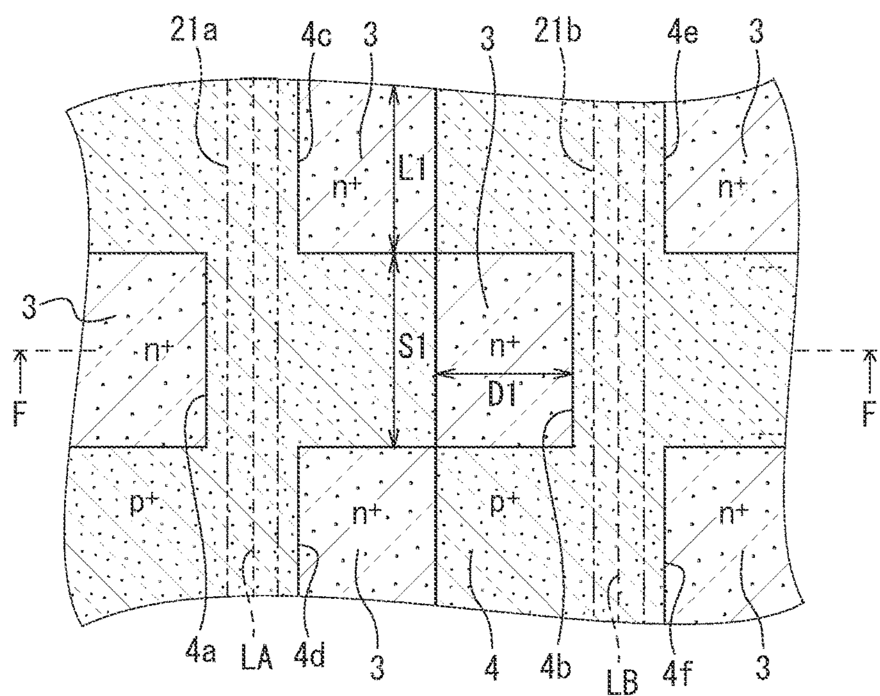
FIG. 17 is a cross-sectional view of the insulated-gate semiconductor device as viewed from direction E-E in FIG. 16.

FIG. 17 is a planar pattern at a horizontal level of the gate-bottom protection-region 4 as viewed from direction E-E in FIG. 16. FIG. 16 is a cross-sectional view as viewed from direction F-F in FIG. 17. FIG. 17 schematically indicates the positions of the trenches 21*a* and 21*b* by the dashed and double-dotted lines (virtual lines) in the same layer level as the CSL 3 allocated on the top surface of the gate-bottom protection-region 4. As illustrated in FIG. 17, the trenches 21*a* and 21*b* extend parallel to each other to have a striped planar pattern. The gate-bottom protection-region 4 is provided with the openings 4*a*, 4*b*, 4*c*, 4*d*, 4*e*, and 4*f* elongated in the longitudinal direction of the trenches 21*a* and 21*b* in a planar pattern.

The openings 4*c*, 4*a*, and 4*d* are arranged alternately and periodically on both sides of the trench 21*a* (in the left-right direction in FIG. 17) to be shifted from each other about the trench 21*a* in the longitudinal direction (in the top-bottom direction in FIG. 17) in a zigzag manner in a planar slot pattern. The openings 4*e*, 4*b*, and 4*f* are arranged alternately and periodically on both sides of the trench 21*b* to be shifted from each other about the trench 21*b* in the longitudinal direction in a zigzag manner in a planar slot pattern. As illustrated in FIG. 17, the rectangular slots of the openings 4*a*, 4*b*, 4*c*, 4*d*, 4*e*, and 4*f* are arranged to have a topology of a deformed checkered pattern.

The other configurations of the insulated-gate semiconductor device according to the second embodiment of the present invention are the same as those of the insulated-gate semiconductor device according to the first embodiment, and overlapping explanations are not repeated below.

The insulated-gate semiconductor device according to the second embodiment includes the gate-bottom protection-region 4 provided with the openings 4*a*, 4*b*, 4*c*, 4*d*, 4*e*, and 4*f* and arranged in contact with the bottoms of the trenches 21*a* and 21*b* in the same manner as in the first embodiment. The gate-bottom protection-region 4 can thus protect the gate-insulating films 9*a* and 9*b* allocated at the bottoms of the trenches 21*a* and 21*b* from high voltage during reverse bias, so as to improve breakdown voltage and reliability of the insulated-gate semiconductor device.

The openings 4*a*, 4*b*, 4*c*, 4*d*, 4*e*, and 4*f*, which are cut in the gate-bottom protection-region 4 in the insulated-gate semiconductor device according to the second embodiment, are arranged to be shifted from each other along the longitudinal direction in a zigzag manner in a planar slot pattern as illustrated in FIG. 17. The arrangement of the openings 4*a*, 4*b*, 4*c*, 4*d*, 4*e*, and 4*f* in the zigzag manner implements a topology of a deformed checkered pattern. As illustrated in FIG. 16, the upper layer part and the lower layer part of the CSL 3 are connected together via the connecting parts penetrating the openings 4*a*, 4*b*, 4*c*, 4*d*, 4*e*, and 4*f*. The multiple arrangement of the rectangular pillar-shaped connecting parts penetrating the openings 4*a*, 4*b*, 4*c*, 4*d*, 4*e*, and 4*f* can reduce saturation current to enhance tolerance to a short-circuit failure in the insulated-gate semiconductor device according to the second embodiment. The structure illustrated in FIGS. 16 and 17 also allows a current having components in the two-dimensional direction to spread through the connecting parts of the CSL 3 penetrating the openings 4*a*, 4*b*, 4*c*, 4*d*, 4*e*, and 4*f*, which are cut in the gate-bottom protection-region 4. Therefore the structure illustrated in FIGS. 16 and 17 can reduce JFET resistance, whole avoiding an increase in on-resistance. Then, the insulated-gate semiconductor device according to the second embodiment can reduce the chip size of the insulated-gate semiconductor device, while reducing the cost of manufacture.

Because the pitch between the adjacent unit cells is reduced, the method of manufacturing the insulated-gate semiconductor device according to the second embodiment can eliminate the step of forming the base-bottom buried-regions 5*a*, 5*b*, and 5*c* illustrated in FIG. 1 in the CSL 3 by photolithography. Furthermore, the method of manufacturing the insulated-gate semiconductor device according to the second embodiment can eliminate the ion implantation step for forming the base-bottom buried-regions 5*a*, 5*b*, and 5*c*. Then, the method of manufacturing the insulated-gate semiconductor device according to the second embodiment differs from the manufacturing method according to the first embodiment. The other process steps are the same as in the method of manufacturing the insulated-gate semiconductor device according to the first embodiment, and overlapping explanations are not repeated below.

Modified Example of Second Embodiment

Figure 18:
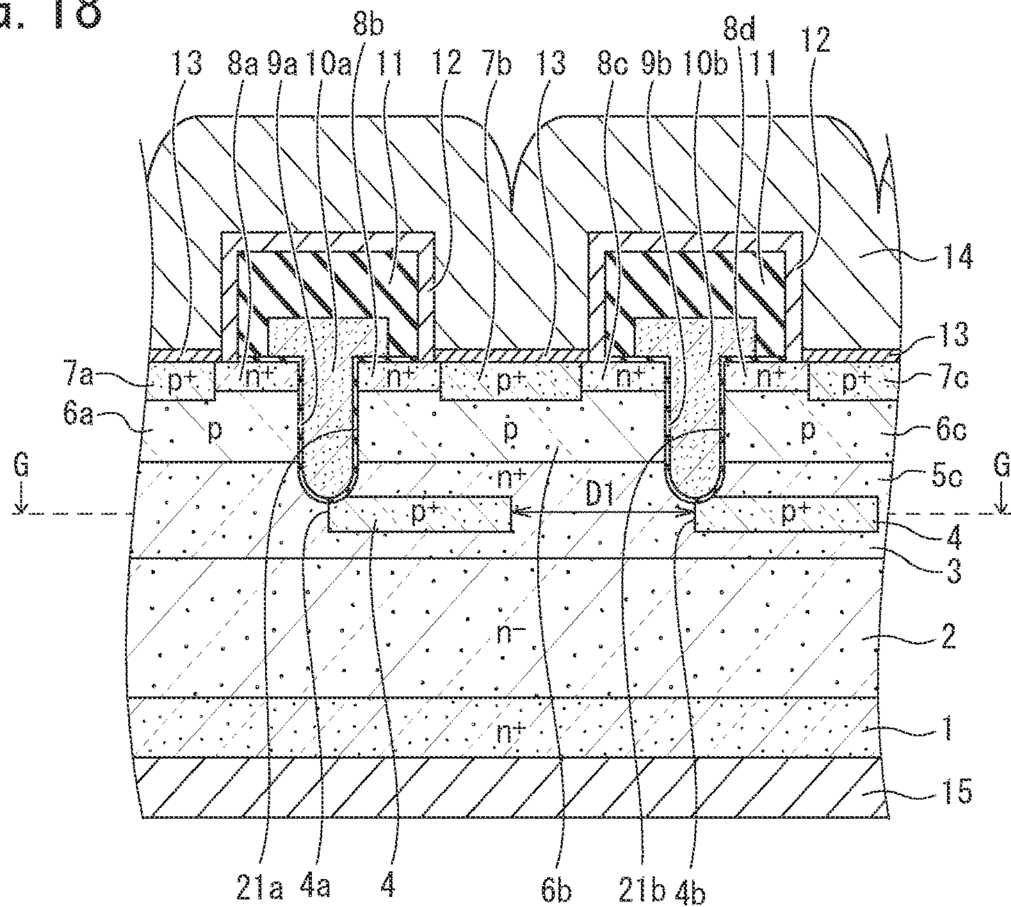
FIG. 18 is a cross-sectional view illustrating a main part of an insulated-gate semiconductor device according to a modified example of the second embodiment.
Figure 19:
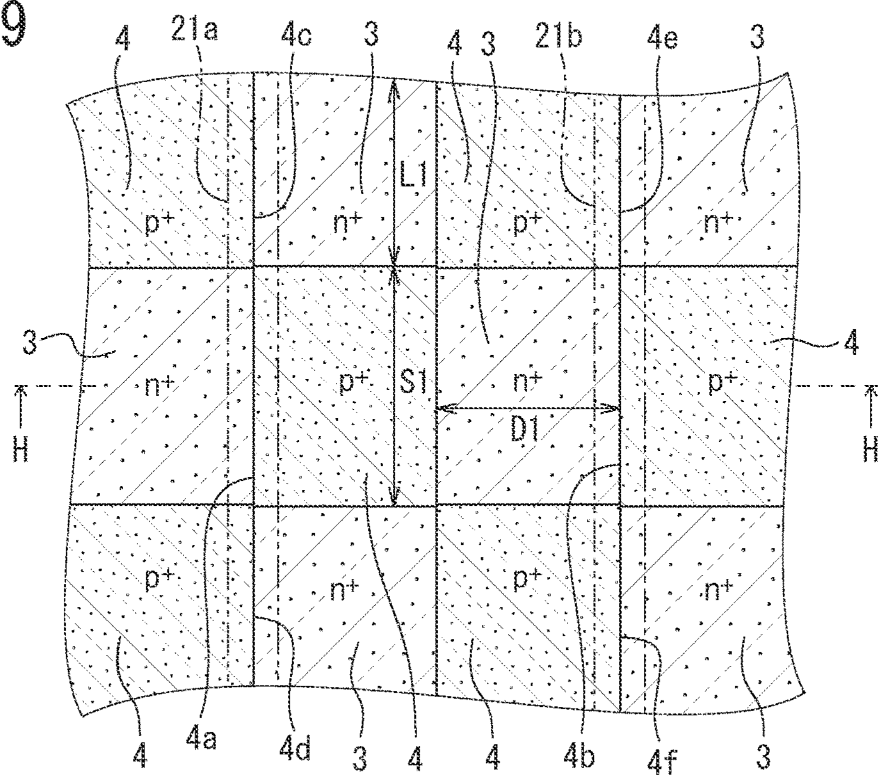
FIG. 19 is a cross-sectional view of the insulated-gate semiconductor device as viewed from direction G-G in FIG. 18.
Figure 20:
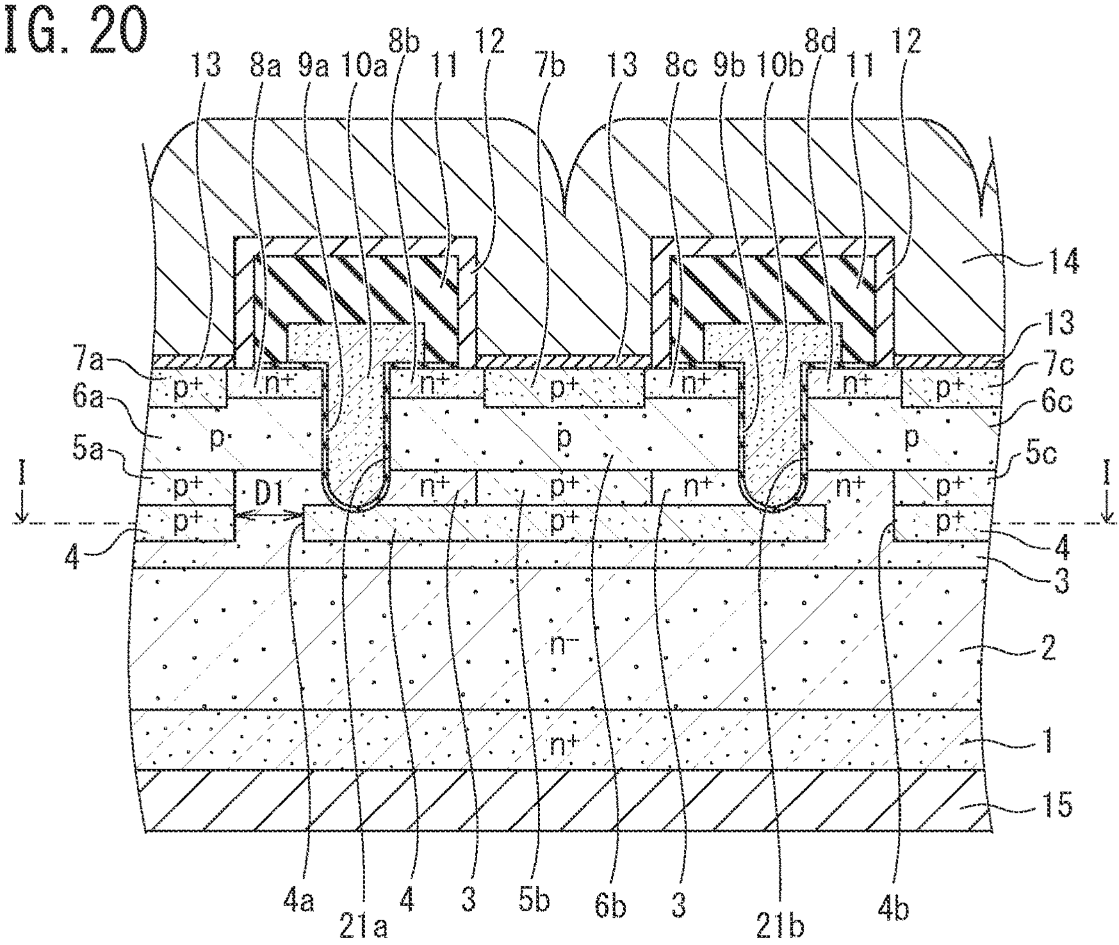
FIG. 20 is a cross-sectional view illustrating a main part of an insulated-gate semiconductor device according to another embodiment of the present invention.

FIG. 18 and FIG. 19 illustrate an insulated-gate semiconductor device according to a modified example of the second embodiment. FIG. 19 is a planar pattern at the horizontal level of the gate-bottom protection-region 4 as viewed from direction G-G in FIG. 18. FIG. 18 is a cross-sectional view as viewed from direction H-H in FIG. 19. As illustrated in FIG. 18 and FIG. 19, the insulated-gate semiconductor device according to the modified example of the second embodiment differs from the insulated-gate semiconductor device according to the second embodiment illustrated in FIG. 16 and FIG. 17 in that the width D1 of the openings 4*a*, 4*b*, 4*c*, 4*d*, 4*e*, and 4*f*, which are cut in the gate-bottom protection-region 4, is wider so that the gate-bottom protection-region 4 does not completely cover the bottoms of the trenches 21*a* and 21*b*. As illustrated in FIG. 19, the gate-bottom protection-region 4 and the openings 4*a*, 4*b*, 4*c*, 4*d*, 4*e*, and 4*f* may be arranged to have a checkered (tiled) planar pattern.

The insulated-gate semiconductor device according to the modified example of the second embodiment also includes the rectangular pillar-shaped connecting parts penetrating the openings 4*a*, 4*b*, 4*c*, 4*d*, 4*e*, and 4*f* to connect the upper layer part and the lower layer part of the CSL 3, as illustrated in FIG. 18 and FIG. 19. The structure illustrated in FIG. 18 and FIG. 19 allows a current having components in the two-dimensional direction to spread through the connecting parts of the CSL 3 penetrating the openings 4*a*, 4*b*, 4*c*, 4*d*, 4*e*, and 4*f*, which are cut in the gate-bottom protection-region 4, so as to reduce JFET resistance.

Other Embodiments

While the present invention has been described above by reference to the first and second embodiments, it should be understood that the present invention is not intended to be limited to the descriptions of the Specification and the drawings composing part of the above disclosure. Various alternative embodiments, examples, and technical applications will be apparent to those skilled in the art according to the above disclosure.

Figure 21:
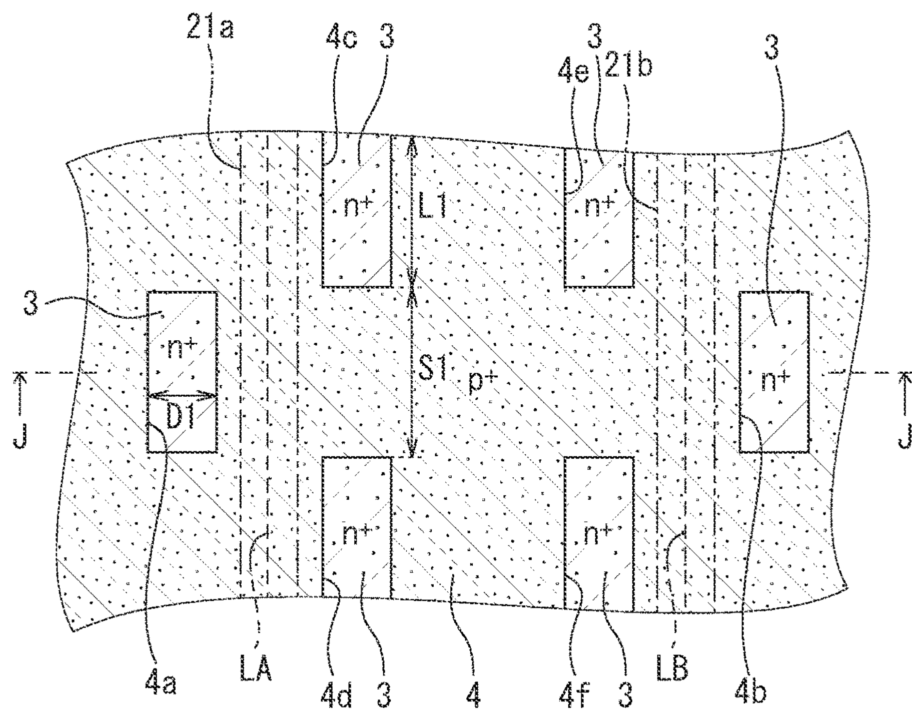
FIG. 21 is a cross-sectional view of the insulated-gate semiconductor device as viewed from direction I-I in FIG. 20.

While the first and second embodiments have exemplified the case in which the openings 4*a*, 4*b*, 4*c*, 4*d*, 4*e*, and 4*f*, which are cut in the gate-bottom protection-region 4, are periodically arranged in the same manner in the respective trenches 21*a* and 21*b* adjacent to each other, the openings 4*a*, 4*b*, 4*c*, 4*d*, 4*e*, and 4*f* may arranged in different period from each other in the respective trenches 21*a* and 21*b*. For example, as illustrated in FIG. 21, the opening 4*a*, which is cut on the left side of the trench 21*a*, and the opening 4*b*, which is cut on the right side of the trench 21*b*, are aligned in the same line in the direction perpendicular to the longitudinal direction of the trenches 21*a* and 21*b* (in the left-right direction in FIG. 21) in a planar pattern. The opening 4*c*, which is cut on the right side of the trench 21*a*, and the opening 4*e*, which is cut on the left side of the trench 21*b*, are aligned in the same line in the direction perpendicular to the longitudinal direction of the trenches 21*a* and 21*b* in a planar pattern. The opening 4*d*, which is cut on the right side of the trench 21*a*, and the opening 4*f*, which is cut on the left side of the trench 21*b*, are aligned in the same line in the direction perpendicular to the longitudinal direction of the trenches 21*a* and 21*b* in a planar pattern.

Figure 22:
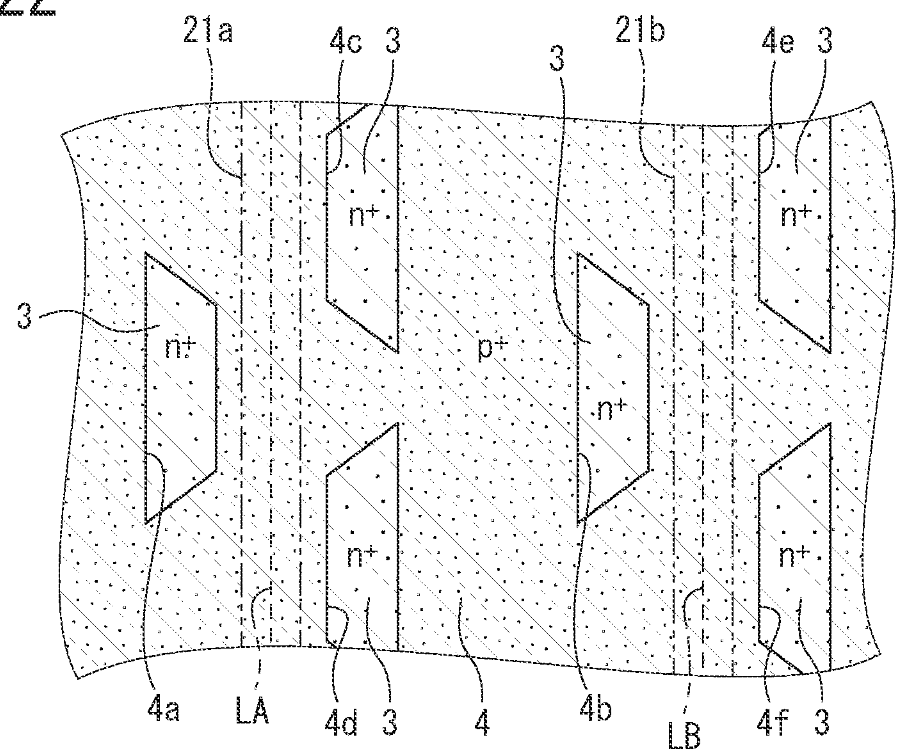
FIG. 22 is another cross-sectional view of the insulated-gate semiconductor device as viewed from direction A-A in FIG. 1.

While the first and second embodiments have exemplified the case in which the openings 4*a*, 4*b*, 4*c*, 4*d*, 4*e*, and 4*f* allowing the connecting parts to penetrate are cut in the gate-bottom protection-region 4 into a rectangular shape in a planar pattern, the openings 4*a*, 4*b*, 4*c*, 4*d*, 4*e*, and 4*f* are not limited to the rectangular shape in a planar pattern. For example, as illustrated in FIG. 22, the openings 4*a*, 4*b*, 4*c*, 4*d*, 4*e*, and 4*f* may be cut in the gate-bottom protection-region 4 into a trapezoidal shape in a planar pattern. The trapezoidal pillar-shaped connecting parts of the CSL 3 illustrated in FIG. 22 penetrating the openings 4*a*, 4*b*, 4*c*, 4*d*, 4*e*, and 4*f*, which are cut in the gate-bottom protection-region 4, also allow a current having components in the two-dimensional direction to spread out, so as to reduce JFET resistance. The trapezoidal shape of the respective openings 4*a*, 4*c*, and 4*d* cut in the gate-bottom protection-region 4 has an upper base parallel to the longitudinal direction of the trench 21*a* and on the side closer to the trench 21*a*, and a lower base parallel to the longitudinal direction of the trench 21*a* and on the side away from the trench 21*a*. The trapezoidal shape of the respective openings 4*b*, 4*e*, and 4*f*, which are cut in the gate-bottom protection-region 4, has an upper base parallel to the longitudinal direction of the trench 21*b* and on the side closer to the trench 21*b*, and a lower base parallel to the longitudinal direction of the trench 21*b* and on the side away from the trench 21*b*.

Figure 23:
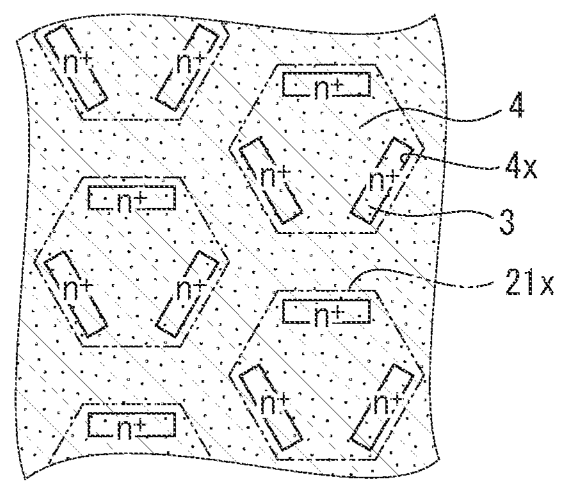
FIG. 23 is a cross-sectional view illustrating an insulated-gate semiconductor device according to another embodiment of the present invention.
Figure 24:
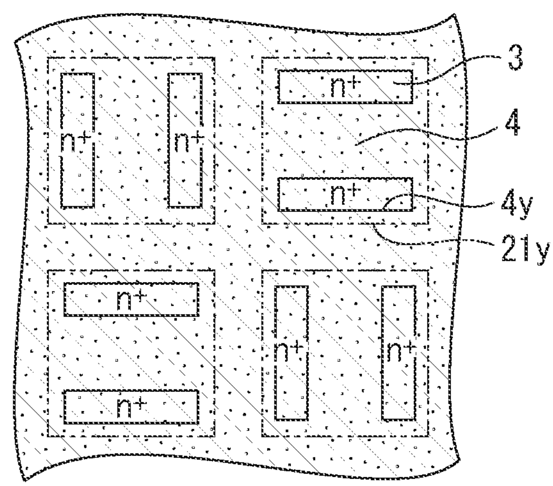
FIG. 24 is a cross-sectional view illustrating an insulated-gate semiconductor device according to another embodiment of the present invention.

While the first and second embodiments have exemplified the case in which the trenches 21*a* and 21*b* have curved bottoms, the trenches 21*a* and 21*b* may have flat bottoms. While the first and second embodiments have exemplified the case in which the trenches 21*a* and 21*b* extend parallel to each other to have a striped planar pattern, the trenches 21*a* and 21*b* may be arranged to have a rectangular planar pattern or a polygonal (such as hexagonal) planar pattern. For example, FIG. 23 and FIG. 24 are horizontal cross-sectional views of modified examples of the planar pattern of the gate-bottom protection-region 4 as viewed from direction A-A in FIG. 1. When trenches 21*x* have a hexagonal planar pattern as indicated by the dashed and double-dotted lines (virtual lines) in FIG. 23, three openings 4*x* may be cut inside the hexagon of each trench 21*x* on every other side. When trenches 21*y* have a square planar pattern as indicated by the dashed and double-dotted lines (virtual lines) in FIG. 24, two openings 4*y* may be cut inside the square of each trench 21*y* on every other side.

While the first and second embodiments have exemplified the MISFET having the insulated-gate electrode structure inside the trench, the present invention is not limited to the MISFET, and may be applied to fabrication of other insulated-gate semiconductor devices having various insulated-gate electrode structures, such as an IGBT having an insulated-gate electrode structure inside a trench. When the present invention is used as a trench gate IGBT, the $n^+$-type source regions 8*a*, 8*b*, 8*c*, and 8*d* in the MISFET illustrated in FIG. 1 may be used as emitter regions, and a $p^+$-type collector region may be disposed on the bottom surface of the drift layer 2, instead of the $n^+$-type drain region 1.

While the first and second embodiments have exemplified the insulated-gate semiconductor device using SiC, the present invention may be applied to fabrication of a semiconductor device using a semiconductor wafer using a wide-bandgap semiconductor such as gallium nitride (GaN), diamond, or aluminum nitride (AlN). The present invention may also be applied theoretically to fabrication of an insulated-gate semiconductor device using silicon (Si), in addition to the fabrication of the semiconductor device using the wide-bandgap semiconductor.

What is claimed is:

1. An insulated-gate semiconductor device, comprising:

a drift layer of a first conductivity type;

a current spreading layer of the first conductivity type having a higher impurity concentration than the drift layer, being disposed on the drift layer;

a base region of a second conductivity type disposed on the current spreading layer;

a main-electrode region of the first conductivity type having a higher impurity concentration than the drift layer and arranged in an upper portion of the base region;

an insulated-gate electrode structure provided in a trench penetrating the main-electrode region and the base region in a depth direction of the trench;

a gate-bottom protection-region of the second conductivity type having a higher impurity concentration than the base region, the gate-bottom protection-region being in contact with a bottom of the trench, wherein the gate-bottom protection-region includes a plurality of openings through which a part of the current spreading layer penetrates, and is selectively buried in the current spreading layer; and a base-bottom buried-region of the second conductivity type having a higher impurity concentration than the base region, bordering a top surface of the gate-bottom protection-region in an upper portion of the current spreading layer, and in direct physical contact with a bottom surface of the base region, wherein the plurality of openings include a first opening disposed on a first side of a central line of the trench and a second opening disposed on a second side of the central line of the trench, the second opening being spaced apart from the first opening in a lateral direction of the trench which is perpendicular to the depth direction and the second opening being offset from the first opening in a longitudinal direction of the trench which is perpendicular to the depth direction and the lateral direction, the central line of the trench is parallel to the longitudinal direction and passes through a center of the trench, and a width of the trench in the lateral direction is shorter than a length of the trench in the longitudinal direction.

2. The insulated-gate semiconductor device of claim 1, wherein the base-bottom buried-region is separated from the trench and buried in direct physical contact with a top surface of the gate-bottom protection-region in the upper portion of the current spreading layer, wherein the gate-bottom protection-region extends in the longitudinal direction of the trench in a planar pattern.

3. The insulated-gate semiconductor device of claim 1, wherein the openings are arranged alternately and periodically on opposite sides of the central line.

4. The insulated-gate semiconductor device of claim 1, wherein the openings have a trapezoidal shape in a planar pattern having an upper base parallel to the longitudinal direction and on a side closer to the trench and a lower base parallel to the longitudinal direction and on a side away from the trench.

5. The insulated-gate semiconductor device of claim 1, wherein the current spreading layer is disposed above a first side of the gate-bottom protection-region which faces away from the drift layer, and the current spreading layer is disposed below a second side of the gate-bottom protection-region which faces toward the drift layer, the first side of the gate-bottom protection-region being opposite to the second side of the gate-bottom protection-region.

6. The insulated-gate semiconductor device of claim 1, wherein the base-bottom buried-region is spaced apart from the trench in the lateral direction by a distance greater than zero, a portion of the current spreading layer being is disposed between the base-bottom buried-region and the trench in the lateral direction, and the distance by which the base-bottom buried-region is spaced apart from the trench in the lateral direction corresponds to a width of the portion of the current spreading layer in the lateral direction.

7. The insulated-gate semiconductor device of claim 1, wherein the current spreading layer is disposed above and in physical contact with a top surface of the gate-bottom protection-region, and below and in physical contact with a bottom surface of the gate-bottom protection-region.

8. The insulated-gate semiconductor device of claim 1, wherein the plurality of openings include a third opening disposed on the second side of the central line of the trench, and the third opening is spaced apart from the second opening in the longitudinal direction by a distance corresponding to a length of the first opening in the longitudinal direction.

9. The insulated-gate semiconductor device of claim 1, wherein the gate-bottom protection-region extends in the lateral direction from the first side of the trench to the second side of the trench without extending to an adjacent trench.

10. An insulated-gate semiconductor device, comprising:

a drift layer of a first conductivity type;

a current spreading layer of the first conductivity type having a higher impurity concentration than the drift layer, being disposed on the drift layer;

a base region of a second conductivity type disposed on the current spreading layer;

a main-electrode region of the first conductivity type having a higher impurity concentration than the drift layer and arranged in an upper portion of the base region;

an insulated-gate electrode structure provided in a trench penetrating the main-electrode region and the base region;

a gate-bottom protection-region of the second conductivity type having a higher impurity concentration than the base region, the gate-bottom protection-region being in contact with a bottom of the trench, wherein the gate-bottom protection-region includes a plurality of openings through which a part of the current spreading layer penetrates, and is selectively buried in the current spreading layer; and a base-bottom buried-region of the second conductivity type having a higher impurity concentration than the base region, and separated from the trench and buried in direct physical contact with a top surface of the gate-bottom protection-region in an upper portion of the current spreading layer, wherein positions of the openings cut on both sides of a central line of the trench are shifted from each other about the central line in a longitudinal direction of the trench in a planar pattern.

11. The insulated-gate semiconductor device of claim 10, wherein the gate-bottom protection-region extends in the longitudinal direction of the trench in a planar pattern.

12. The insulated-gate semiconductor device of claim 10, wherein the openings are arranged alternately and periodically on both sides of the central line.

13. The insulated-gate semiconductor device of claim 10, wherein the openings have a trapezoidal shape in a planar pattern having an upper base parallel to the longitudinal direction and on a side closer to the trench and a lower base parallel to the longitudinal direction and on a side away from the trench.

14. The insulated-gate semiconductor device of claim 10, wherein the current spreading layer is disposed above and in physical contact with a top surface of the gate-bottom protection-region, and below and in physical contact with a bottom surface of the gate-bottom protection-region.

* * * * *

UNITED STATES PATENT AND TRADEMARK OFFICE

CERTIFICATE OF CORRECTION

PATENT NO. : 11,329,151 B2
APPLICATION NO. : 16/142309
DATED : May 10, 2022
INVENTOR(S) : Akimasa Kinoshita et al.

It is certified that error appears in the above-identified patent and that said Letters Patent is hereby corrected as shown below:

In the Claims

Column 16, Line 4:
In Claim 6, delete "layer being" and insert --layer--.

Signed and Sealed this
Twenty-eighth Day of June, 2022

Katherine Kelly Vidal

Katherine Kelly Vidal
*Director of the United States Patent and Trademark Office*